United States Patent
Miki

(10) Patent No.: US 9,372,246 B2
(45) Date of Patent: Jun. 21, 2016

(54) FLOW-THROUGH NMR ANALYZER

(75) Inventor: Takashi Miki, Kobe (JP)

(73) Assignee: Kobe Steel, Ltd., Hyogo (JP)

( * ) Notice: Subject to any disclaimer, the term of this patent is extended or adjusted under 35 U.S.C. 154(b) by 722 days.

(21) Appl. No.: 13/636,979

(22) PCT Filed: Mar. 25, 2011

(86) PCT No.: PCT/JP2011/001777
§ 371 (c)(1),
(2), (4) Date: Sep. 24, 2012

(87) PCT Pub. No.: WO2011/118229
PCT Pub. Date: Sep. 29, 2011

(65) Prior Publication Data
US 2013/0009645 A1    Jan. 10, 2013

(30) Foreign Application Priority Data
Mar. 25, 2010   (JP) .................... 2010-070567

(51) Int. Cl.
*G01R 33/341* (2006.01)
*G01R 33/30* (2006.01)
(Continued)

(52) U.S. Cl.
CPC ........ *G01R 33/307* (2013.01); *G01R 33/34092* (2013.01); *G01R 33/3804* (2013.01); *G01R 33/3875* (2013.01)

(58) Field of Classification Search
CPC ............... G01R 33/383; G01R 33/307; G01R 33/34069; G01R 33/34092; G01R 33/3635; G01R 33/3804; G01R 33/3875; G01R 33/465
USPC .......................... 324/149, 318, 320, 321, 322
See application file for complete search history.

(56) References Cited

U.S. PATENT DOCUMENTS

| 4,862,087 A | 8/1989 | Hillenbrand et al. |
| 6,177,798 B1 | 1/2001 | Haner et al. |

(Continued)

FOREIGN PATENT DOCUMENTS

| EP | 0813071 A1 | 12/1997 |
| EP | 1666907 A2 | 6/2006 |

(Continued)

OTHER PUBLICATIONS

The extended European search report issued by the European Patent Office on Jun. 18, 2014, which corresponds to European Patent Application No. 11759038.0-1560 and is related to U.S. Appl. No. 13/636,979.

(Continued)

*Primary Examiner* — Melissa Koval
*Assistant Examiner* — Rishi Patel
(74) *Attorney, Agent, or Firm* — Studebaker & Brackett PC

(57) ABSTRACT

The flow-through NMR analyzer comprises: a solution feeding pipe for flowing a sample; a superconducting magnet that encloses a housing space, which is surrounded by a side wall of the solution feeding pipe, around an axis of the solution feeding pipe such that a static magnetic field is generated along the axis of the solution feeding pipe; a vacuum container which houses the superconducting magnet in a cooled state and which encloses the housing space around the axis of the solution feeding pipe; and an RF coil which applies high-frequency electromagnetic waves to the sample inside the housing space and which detects an NMR signal from the sample. The RF coil is integrally formed with the side wall of the solution feeding pipe in a region of the solution feeding pipe that is enclosed by the superconducting magnet and the magnetic field correcting coil.

5 Claims, 10 Drawing Sheets

(51) Int. Cl.
*G01R 33/34* (2006.01)
*G01R 33/38* (2006.01)
*G01R 33/3875* (2006.01)

(56) References Cited

U.S. PATENT DOCUMENTS

| | | |
|---|---|---|
| 6,304,769 B1 | 10/2001 | Arenson et al. |
| 7,449,890 B2 | 11/2008 | Kitagawa et al. |
| 7,612,563 B2 | 11/2009 | Massin et al. |
| 8,106,657 B2 | 1/2012 | Sakellariou et al. |
| 8,143,896 B2 | 3/2012 | McDowell et al. |
| 2004/0004478 A1 | 1/2004 | Hofmann et al. |
| 2006/0091885 A1* | 5/2006 | Rindlisbacher et al. ...... 324/321 |
| 2007/0273381 A1 | 11/2007 | Kitagawa et al. |
| 2008/0100296 A1 | 5/2008 | Massin et al. |
| 2009/0015259 A1 | 1/2009 | Courtney |
| 2009/0146658 A1* | 6/2009 | McDowell ........... G01N 24/088 324/309 |
| 2010/0156414 A1* | 6/2010 | Sakellariou et al. .......... 324/309 |
| 2010/0207631 A1 | 8/2010 | McDowell et al. |
| 2012/0112744 A1 | 5/2012 | McDowell et al. |

FOREIGN PATENT DOCUMENTS

| | | |
|---|---|---|
| JP | 2004-219281 | 8/2004 |
| JP | 2005-331271 | 12/2005 |
| JP | 2007-315826 A | 12/2007 |
| JP | 2008-107352 A | 5/2008 |
| JP | 2009-020095 A | 1/2009 |
| JP | 2008-545148 A | 12/2011 |
| WO | WO 2008-119054 A1 | 10/2008 |
| WO | WO 2009-055587 A1 | 4/2009 |

OTHER PUBLICATIONS

International Search Report, from the International Bureau, in corresponding International Application No. PCT/JP2011/001777, mailed Jun. 21, 2011, 2 pages.
A. Webb, "Nuclear Magnetic Resonance of Mass-Limited Samples Using Small RF Coils," Anal Bioanal Chem (2007), vol. 388, pp. 525-528.
K. Albert et al., "Reversed-Phase High-Performance Liquid Chromatography-Nuclear Magnetic Resonance On-Line Coupling With Solvent Non-Excitation," Journal of Chromatography, vol. 463, (1989), pp. 355-363.
D.M. Ginsberg et al., "Optimum Geometry of Saddle Shaped Coils for Generating a Uniform Magnetic Field," The Review of Scientific Instruments, vol. 41, No. 1, Jan. 1970, pp. 122-123.
International Preliminary Report on Patentability, issued from the International Bureau, in corresponding International Application No. PCT/JP2011/001777, mailed Oct. 11, 2012, 7 pages.
Office Action issued in corresponding Japanese Patent Application No. 2010-070567, mailed Jun. 4, 2013, 3 pages in Japanese and 5 pages in its English translation.

* cited by examiner

FLOW-THROUGH NMR ANALYZER

This application is the U.S. National Stage and claims the priority of International Application No. PCT/JP2011/001777, filed Mar. 25, 2011, which claims the priority from Japanese Patent Application No. 2010-070567, filed on Mar. 25, 2010, the content of which is hereby incorporated by reference into this application.

TECHNICAL FIELD

The present invention relates to an NMR (Nuclear Magnetic Resonance) analyzer.

BACKGROUND ART

Conventionally, NMR analyzers are known which comprise a superconducting magnet for internally generating a powerful static magnetic field and an RF coil provided inside the superconducting magnet and which is configured so as to detect an NMR signal of a sample inserted into the RF coil (for example, Patent Document 1).

Hereinafter, a specific configuration of a conventional NMR analyzer will be described with reference to FIG. 11.

The NMR analyzer comprises an analyzer main body 100, a probe inserted into a hole 100a of the analyzer main body 100, and a test tube 105 inserted into the probe. The analyzer main body 100 comprises a superconducting magnet 101 for generating a static magnetic field in the hole 100a, and an insulating container 102 for housing the superconducting magnet 101 together with a coolant such as liquid helium. The probe comprises a magnetic field correcting member 103 having a magnetic field correcting coil 103a and a coil supporting tube 104 having an RF coil 104a fixed to the inside of the magnetic field correcting coil 103a. In addition, an NMR signal of a sample inside the test tube 105 is detected in a state where the sample is arranged inside the RF coil 104a. Moreover, a plurality of fins 105a provided on the test tube 105 are for rotating the test tube 105 around an axis thereof using air that blows out from an outlet (not shown). Due to the static magnetic field applied to the sample being averaged in a direction of rotation by such a rotational motion of the test tube 105, detection accuracy can be increased.

With the conventional NMR analyzer shown in FIG. 11, in order to analyze a plurality of samples, each sample must be placed in a different test tube 105 and the test tubes 105 must be sequentially replaced and mounted to the analyzer main body 100. To this end, the RF coil 104a is fixed to the analyzer main body 100 to enable the RF coil 104a to be commonly used for the respective test tubes 105.

Therefore, with the conventional NMR analyzer, a size of the RF coil 104a is determined based on a size of the test tube 105 and, accordingly; sizes of the magnetic field correcting member 103 and the superconducting magnet 101 (insulating container 102) which enclose the RF coil 104a are determined. This made downsizing of the entire NMR analyzer impossible. Specifically, with the conventional NMR analyzer, since the size of the RF coil 104a is set based on an assumed maximum size of the test tube 105, the size of the RF coil 104a restricts downsizing of the magnetic field correcting member 103 and the superconducting magnet 101 which enclose the RF coil 104a. As a result, there is a limit to how much the entire NMR analyzer can be downsized.

In addition, from the perspective of detection sensitivity per unit volume of a sample, the following problem is observed. Specifically, with the conventional NMR analyzer, the size of the RF coil 104a is set based on an assumed maximum size of the test tube 105. Therefore, it is difficult to improve the detection sensitivity of NMR signals when a test tube that is thinner than the assumed maximum size is used. A reason therefor will now be described with reference to FIG. 12.

FIG. 12 is a perspective view showing a widely used saddle-shaped RF coil. An upper side section and a lower side section of the saddle-shaped coil shown in FIG. 12 depict an arc along a circumferential direction of a test tube. In addition, a side connecting the upper side section and the lower side section is arranged along a longitudinal direction of the test tube. In this saddle-shaped coil, h defines a height along the longitudinal direction of the test tube and D defines a diameter of the arc depicted by the upper side section and the lower side section. An optimum geometry of a saddle-shaped coil of this type is reported in, for example, a reference ("Optimum Geometry of Saddle Shaped Coils for Generating a Uniform Magnetic Field", The Review of Scientific Instruments, Vol. 41, Number 1, pp.122). Specifically, the reference reports an optimum geometry of the saddle-shaped coil shown in FIG. 12 of $\phi=120°$, h=2D, where $\phi$ defines a central angle of the arc depicted by the upper side section and the lower side section of the saddle-shaped coil. In addition, with a saddle-shaped coil with an optimum geometry, it is known that a detection sensitivity of NMR signals per unit volume of a sample is proportional to B1/I that represents an RF magnetic field B1 per unit current I that flows through the RF coil. According to Expression 1 below which represents B1/I, the detection sensitivity of a saddle-shaped coil is inversely proportional to the diameter dimension D.

$$\frac{B_1}{I} = \frac{4}{\pi}\mu_0 \frac{h}{D^2}\left(s^{-\frac{1}{2}} + s^{-\frac{3}{2}}\right)\sin(60°) = \frac{4\mu_0}{\pi \cdot D} \times 0.465 \quad \text{[Expression 1]}$$

Therefore, when there is a long distance between the RF coil 104a and the test tube 105, the detection sensitivity of NMR signals cannot be increased to an originally attainable level.

Patent Document 1: Japanese Patent Application Laid-open No. 2004-219281 (in particular, paragraph [0004])

SUMMARY OF THE INVENTION

An object of the present invention is to provide a compact NMR analyzer with high NMR signal detection sensitivity.

The inventors of the present application focused on the fact that, when analyzing a plurality of samples, by adopting a solution feeding pipe capable of alternately flowing a plurality of samples in place of a conventional test tube, NMR signals of the plurality of samples can be obtained while keeping the solution feeding pipe fixed to the side of an analyzer. As a result, the inventors of the present application have devised the following invention in which a detecting coil is formed in a solution feeding pipe instead of on the side of an analyzer and the detecting coil is commonly used for a plurality of samples.

Specifically, in order to solve the problem described above, the present invention provides a flow-through NMR analyzer for detecting an NMR signal of a sample fed from a solution feeding pump, the flow-through NMR analyzer comprising: a solution feeding pipe for circulating the sample fed from the solution feeding pump; a superconducting magnet that encloses a sample housing space, which is surrounded by a side wall of the solution feeding pipe, around an axis of the solution feeding pipe such that a static magnetic field is generated along the axis of the solution feeding pipe; a housing container which houses the superconducting magnet in a cooled state and which encloses the housing space around the axis of the solution feeding pipe; a magnetic field correcting coil which encloses the housing space around the axis of the solution feeding pipe between the housing container and the solution feeding pipe and which corrects homogeneity of a magnetic field in the housing space; and a detecting coil which applies high-frequency electromagnetic waves to the sample inside the housing space and which detects the NMR signal from the sample, wherein the detecting coil is integrally formed with the side wall of the solution feeding pipe in a region of the solution feeding pipe that is enclosed by the superconducting magnet and the magnetic field correcting coil.

According to the present invention, a compact flow-through NMR analyzer with high NMR signal detection sensitivity can be provided.

MODE FOR CARRYING OUT THE INVENTION

Hereinafter, an embodiment of the present invention will be described with reference to the accompanying drawings. The following embodiment is merely one specific example of the present invention and is not intended to limit the technical scope of the present invention.

Figure 1:
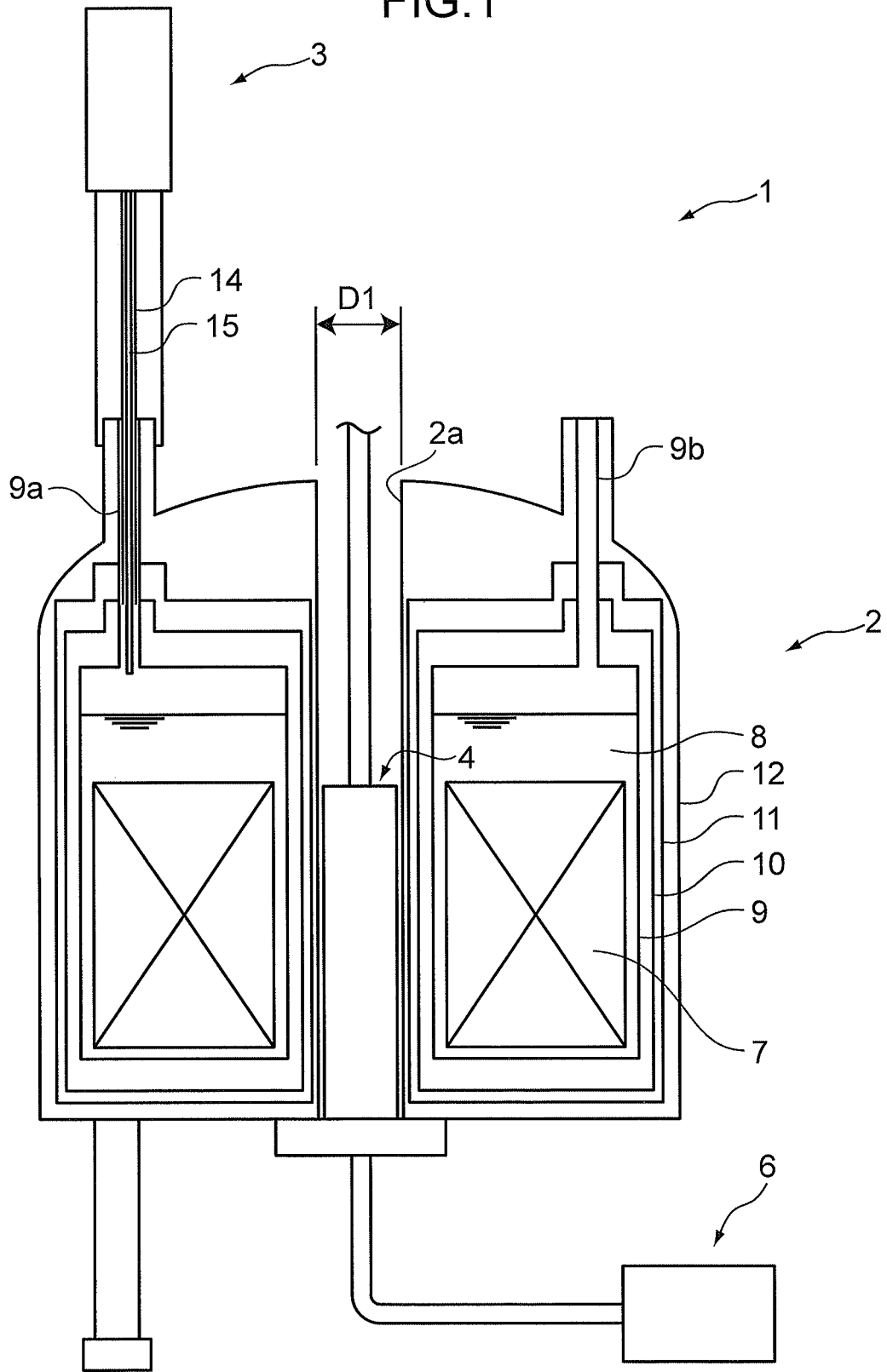
FIG. 1 is a front sectional view schematically showing an overall configuration of a flow-through NMR analyzer according to an embodiment of the present invention.

FIG. 1 is a front-sectional view schematically showing an overall configuration of a flow-through NMR analyzer according to an embodiment of the present invention.

With reference to FIG. 1, a flow-through NMR analyzer (hereinafter, referred to as an NMR analyzer) 1 is for detecting an NMR signal of a sample fed from a solution feeding pump 6. Specifically, the NMR analyzer 1 comprises: a magnetic field generating unit 2 for generating a static magnetic field inside a first through hole 2a; a recondensing unit 3 provided in the magnetic field generating unit 2 for recondensing a coolant that had vaporized in the magnetic field generating unit 2; a magnetic field correcting unit 4 for correcting homogeneity of a magnetic field in the first through hole 2a; a probe 5 provided in the magnetic field correcting unit 4 for holding a sample inside the first through hole 2a; and a solution feeding pump 6 for feeding a sample to the probe 5. In the present embodiment, a diameter D1 of the first through hole 2a of the magnetic field generating unit 2 is set to 20 mm.

The magnetic field generating unit 2 comprises: a tubular superconducting magnet 7; a helium container 9 which houses the superconducting magnet 7 and a coolant (for example, liquid helium) 8 for cooling the superconducting magnet 7; a vacuum container 12 which internally forms a vacuum chamber and which houses the helium container 9 inside the vacuum chamber; and a heat shield 10 and a heat shield 11 which enclose the helium container 9 between the helium container 9 and the vacuum container 12 to suppress thermal radiation from the vacuum container 12. The helium container 9 has two neck tubes 9a and 9b that extend upward. In the present embodiment, the vacuum container 12 corresponds to a housing container. The heat shields 10 and 11 are respectively thermally connected to midsections of the neck tubes 9a and 9b. In addition, upper end sections of the neck tubes 9a and 9b respectively penetrate the vacuum container 12 and are opened to the above. The recondensing unit 3 is attached to the neck tube 9a. Meanwhile, in the present embodiment, a lid (not shown) is attached to the neck tube 9b and closes the upper opening of the neck tube 9b. Alternatively, by providing another recondensing unit 3 on the neck tube 9b, efficiency of recondensation of liquid helium can be increased.

The recondensing unit 3 is for recondensing helium that vaporizes in the helium container 9 and rises in the neck tube 9a and for cooling the respective heat shields 10 and 11. Specifically, the recondensing unit 3 comprises: a two-stage cooling machine having a first stage set to a temperature of 30 K to 50 K and a second stage set to a temperature of 3 K to 4.5 K; a first sleeve 14 thermally connected to the first stage of the cooling machine; and a second sleeve 15 which is provided on an inner side of the first sleeve 14 and which is thermally connected to the second stage of the cooling machine. The first sleeve 14 is inserted into the neck tube 9a of the helium container 9 and, at the same time, thermally connected to an inner surface of the neck tube 9a at a contact position with the heat shields 10 and 11. The second sleeve 15 extends further downward than the first sleeve 14 and a tip section thereof is arranged in a vicinity of a liquid level of the liquid helium 8. In addition, the recondensing unit 3 uses the first sleeve 14 to cool the heat shields 10 and 11 via the neck tube 9a and uses the second sleeve 15 to recondense the vaporized helium and return the recondensed helium to the helium container 9.

Figure 2:
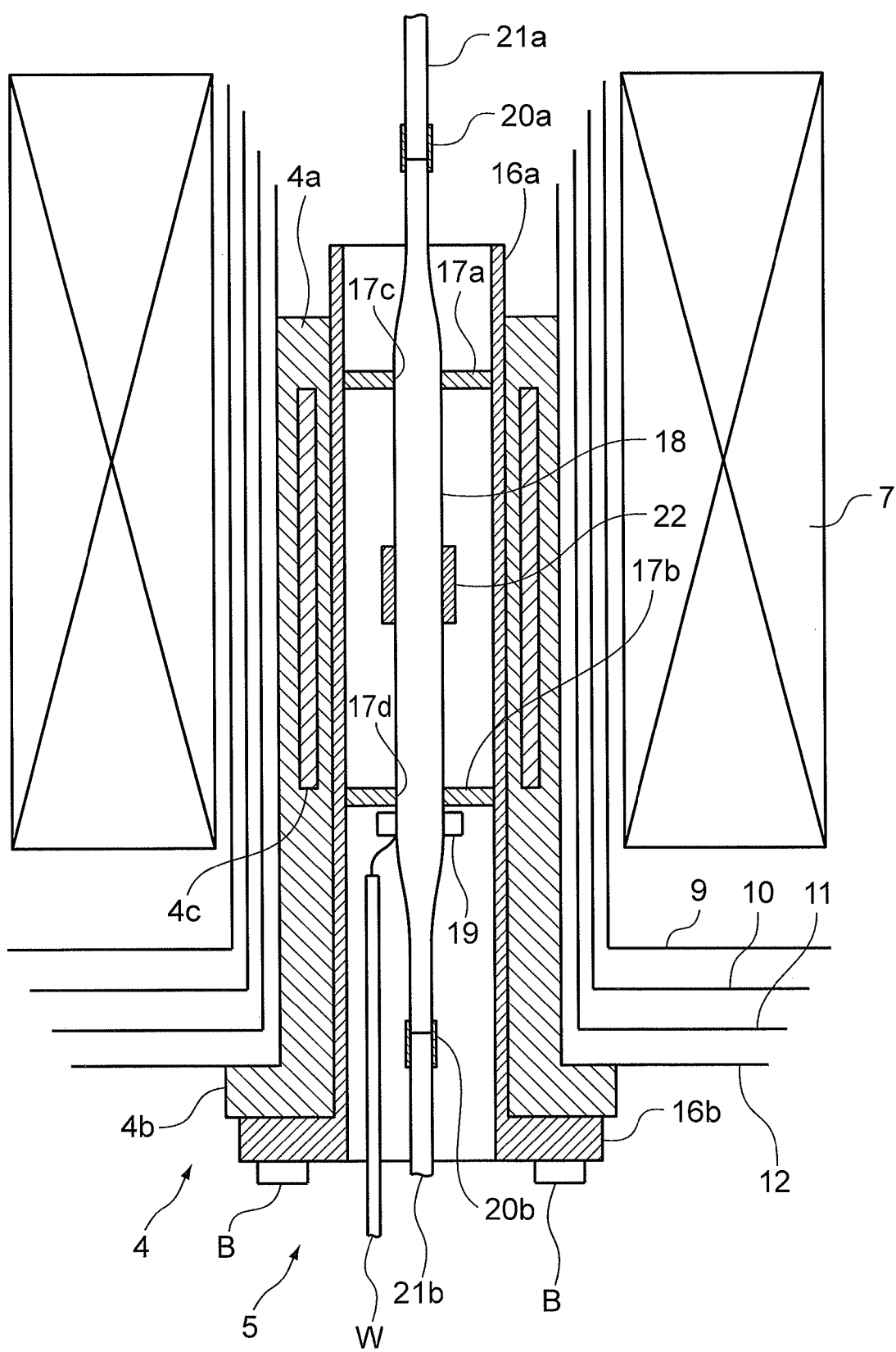
FIG. 2 is a front sectional view showing an enlargement of a part of the NMR analyzer shown in FIG. 1.
Figure 3:
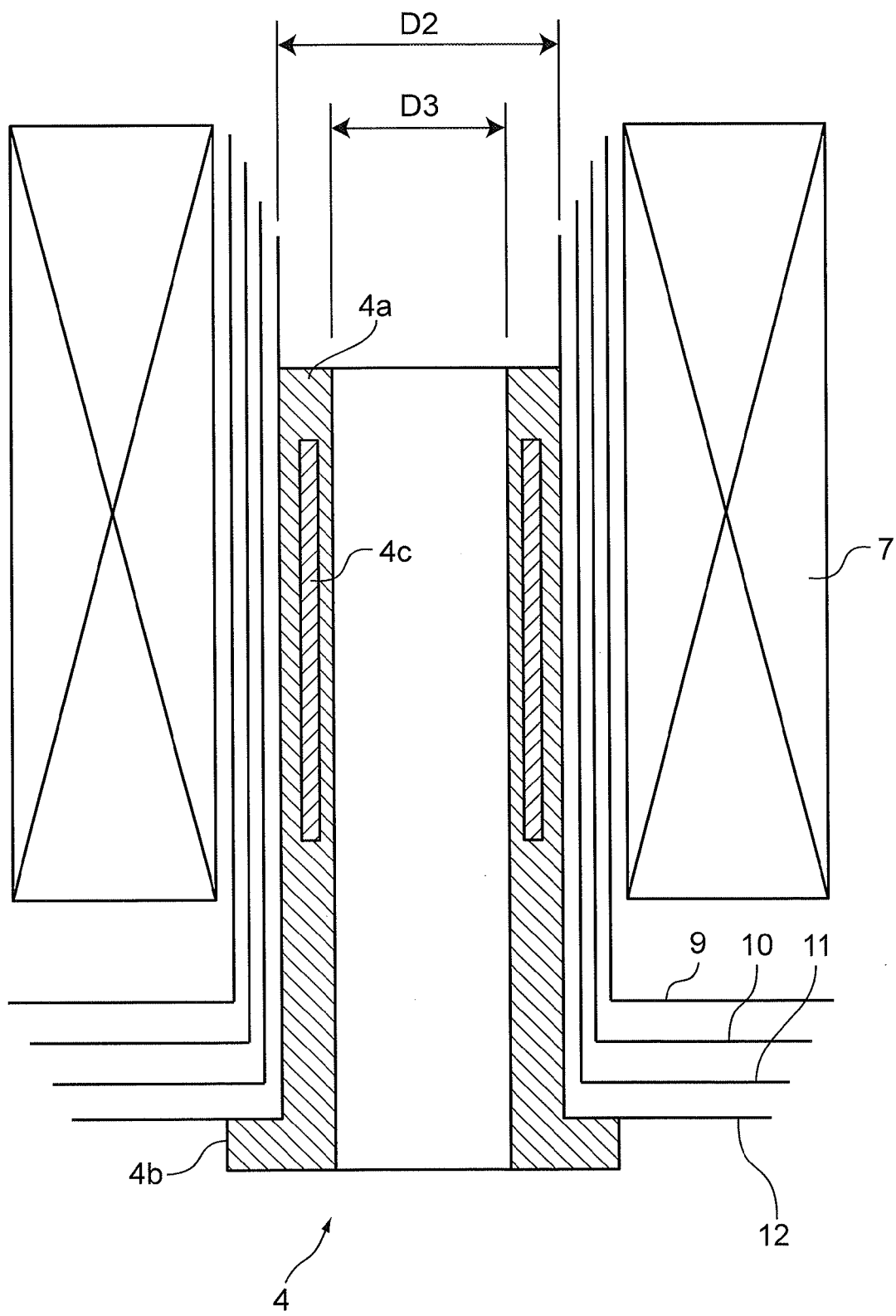
FIG. 3 is a front sectional view in which a probe shown in FIG. 2 has been omitted.

FIG. 2 is a front sectional view showing an enlargement of a part of the NMR analyzer 1 shown in FIG. 1. FIG. 3 is a front sectional view in which the probe 5 shown in FIG. 2 has been omitted.

With reference to FIGS. 2 and 3, the magnetic field correcting unit 4 comprises: a tubular section 4a inserted into the first through hole 2a of the magnetic field generating unit 2; a flange section 4b that protrudes outward from a lower end section of the tubular section 4a; and a magnetic field correcting coil 4c embedded inside the tubular section 4a. By inserting the tubular section 4a into the first through hole 2a until an upper surface of the flange section 4b abuts a lower surface of the vacuum container 12, the magnetic field correcting coil 4c is arranged at a position on an inner side of the superconducting magnet 7. A part of the tubular section 4a enclosed by the superconducting magnet 7 is made of FRP (Fiber Reinforced Plastics), and a part of the tubular section 4a below the superconducting magnet 7 is made of aluminum. The flange section 4b is also made of aluminum. Furthermore, the tubular section 4a and the flange section 4b correspond to a holding unit according to the present embodiment. In the present embodiment, an outside diameter D2 of the tubular section 4a is 19.8 mm and an inside diameter D3 of the tubular section 4a is 10 mm. Furthermore, a vertical length of the magnetic field correcting coil 4c is 40 mm. The magnetic field correcting coil 4c is made of copper and is embedded in the tubular section 4a by a same method (refer to FIGS. 6 to 10) as that used to embed an RF coil 22 in a solution feeding pipe 18 (to be described later). Alternatively, the magnetic field correcting coil 4c may be constituted by a conducting wire wound around the tubular section 4a.

Figure 4:
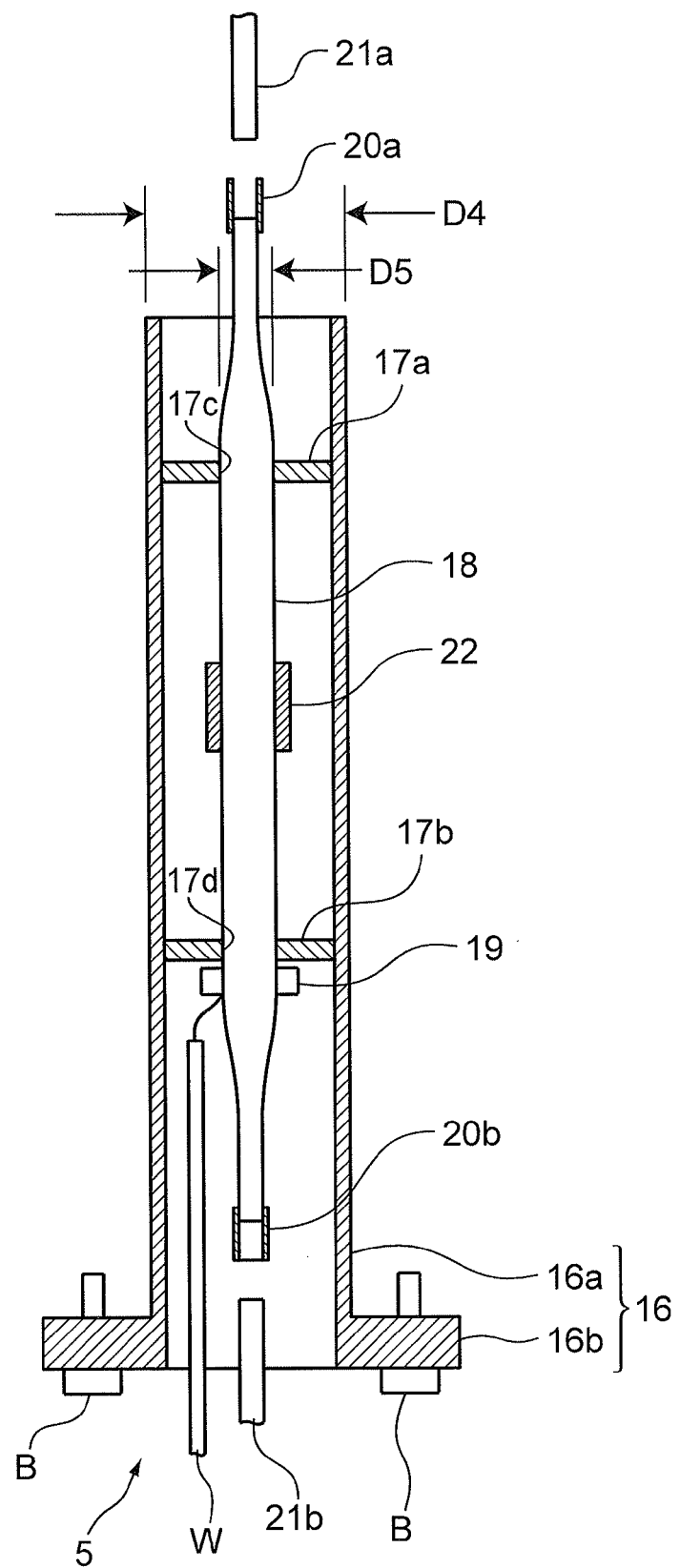
FIG. 4 is a front sectional view showing an enlargement of the probe shown in FIG. 2.

FIG. 4 is a front sectional view showing an enlargement of the probe 5 shown in FIG. 2.

With reference to FIGS. 2 and 4, the probe 5 comprises: a mounting member 16 mounted to the magnetic field correcting unit 4 in a state of being inserted into a hole in the tubular section 4a of the magnetic field correcting unit 4; a pair of upper and lower fixing plates 17a and 17b formed on an inner side of the mounting member 16; a solution feeding pipe 18 held by the fixing plates 17a and 17b; an RF coil (detecting coil) 22 integrally formed with a side wall of the solution feeding pipe 18 in a region of the solution feeding pipe 18 that is enclosed by the superconducting magnet 7 and the magnetic field correcting coil 4c; a circuit section 19 electrically connected to the RF coil 22; a coaxial cable W electrically connected to the circuit section 19; and connecting sections 20a and 20b provided on both ends of the solution feeding pipe 18.

The mounting member 16 is a member made of aluminum which integrally comprises a tubular body 16a inserted into the tubular section 4a of the magnetic field correcting unit 4 and a flange section 16b that protrudes outward from a lower end section of the tubular body 16a. The mounting member 16 is fixed to the magnetic field correcting unit 4 by screwing a bolt B into a female screw section (not shown) formed at both flange sections 4b and 16b in a state where an upper surface of the flange section 16b abuts a lower surface of the flange section 4b of the magnetic field correcting unit 4. The mounting member 16 can be detached from the magnetic field correcting unit 4 by unscrewing the bolt B. In the present embodiment, an outside diameter dimension D4 of the tubular body 16a is 9.8 mm.

The fixing plates 17a and 17b are fixed to an inner surface of the tubular body 16a at an interval corresponding to a length of the magnetic field correcting coil 4c or, in other words, at an interval of 40 mm. Insertion holes 17c and 17d which vertically penetrate the fixing plates 17a and 17b in order to allow the solution feeding pipe 18 to be inserted are respectively formed in the fixing plates 17a and 17b. Alternatively, by forming vertically-penetrating holes in the fixing plates 17a and 17b in addition to the insertion holes 17c and 17d, air can be pumped into the probe 5 using a blower (not shown). As a result, temperature control of the solution feeding pipe 18 can be performed.

A midsection of the solution feeding pipe 18 is enclosed by the superconducting magnet 7, the vacuum container 12, and the magnetic field correcting coil 4c around the axis of the solution feeding pipe 18. Therefore, a static magnetic field along an axial direction of the solution feeding pipe 18 is applied by the superconducting magnet 7 to a sample inside the solution feeding pipe 18. In addition, the solution feeding pipe 18 is a cylindrical glass pipe fixed by the respective fixing plates 17a and 17b in a state where the solution feeding pipe 18 is inserted into the insertion holes 17c and 17d. The solution feeding pipe 18 internally comprises a housing space enclosed by a cylindrical side wall. Furthermore, the solution feeding pipe 18 is shaped such that both end sections thereof are thinner than the midsection thereof which is fixed by the respective fixing plates 17a and 17b. The midsection of the solution feeding pipe 18 has an outer diameter dimension D5 set to 3 mm. The RF coil 22 is provided at a position of the solution feeding pipe 18 between the respective fixing plates 17a and 17b. In addition, the solution feeding pipe 18 comprises a lower end section (first end section) to which a solution feeding tube (feed tube) 21b is connected and an upper end section (second end section) to which a solution feeding tube (discharge tube) 21a is connected.

Figure 5:
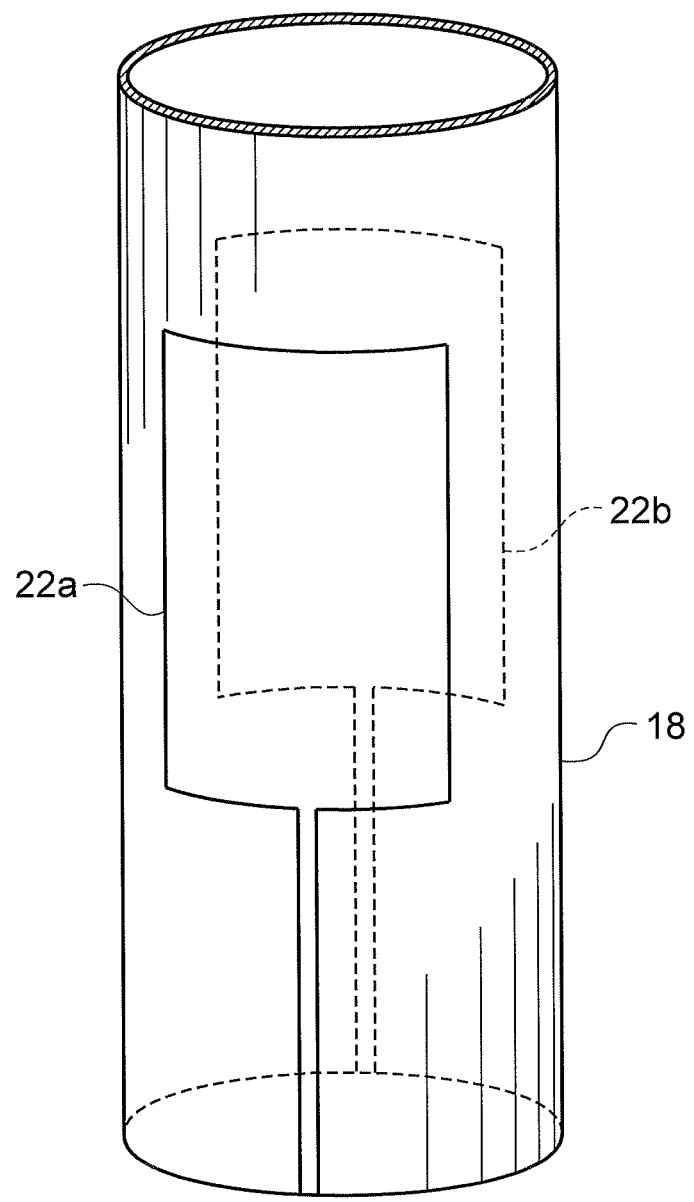
FIG. 5 is a perspective view showing an enlargement of an RF coil shown in FIG. 2.

FIG. 5 is a perspective view showing an enlargement of the RF coil 22 shown in FIG. 2.

With reference to FIGS. 4 and 5, the RF coil 22 is for applying high-frequency electromagnetic waves to the sample inside the solution feeding pipe 18 and for detecting an NMR signal from the sample. Specifically, the RF coil 22 comprises two coils 22a and 22b provided at a 180-degree interval around the axis of the solution feeding pipe 18. The coils 22a and 22b have a so-called saddle-shape. Specifically, with the coils 22a and 22b, respective upper parts thereof have an approximately rectangular shape in which a side facing downward among each rectangle is split midway to constitute a pair of lead sections respectively extending downward. The lead sections of the coils 22a and 22b are respectively electrically connected to a circuit section 19. In the present embodiment, the RF coil 22 is formed on an outer surface of the solution feeding pipe 18 by patterning (depositing) copper on the outer surface of the solution feeding pipe 18 in the saddle shape. The RF coil 22 preferably has a thickness that is equal to or greater than three times a surface penetration depth of a frequency during an observation. For example, when the material of the RF coil 22 is copper and the frequency during observation is 400 MHz, the thickness of the RF coil 22 is preferably set to 10 to 20 μm.

With reference to FIG. 4, the circuit section 19 comprises a capacitor and a coil (not shown), and constitutes a resonant circuit by being connected to the RF coil 22. While the resonant circuit constituted by the RF coil 22 and the circuit section 19 may resonate at a single frequency, the resonant circuit preferably resonates at a plurality of frequencies (for example, at 399.952 MHz and 61.395 MHz, because if a center of the static magnetic field generated by the superconducting magnet 7 is 9.39 T, then a 1 H resonant frequency is 399.952 MHz and a 2 H resonant frequency is 61.395 MHz). Power is supplied to the circuit section 19 via a coaxial wire W and, at the same time, an NMR signal obtained from a sample is transmitted via the coaxial wire W to an amplifier (not shown).

The connecting section 20a is provided on an upper end section of the solution feeding pipe 18. In addition, the connecting section 20b is provided on a lower end section of the solution feeding pipe 18. The connecting sections 20a and 20b are for respectively connecting the solution feeding tube (discharge tube) 21a and the solution feeding tube (feed tube)

21b to the solution feeding pipe 18. Specifically, the connecting section 20b detachably connects the solution feeding tube 21b connected to the solution feeding pump 6 to the lower end section of the solution feeding pipe 18. In addition, the connecting section 20a detachably connects the solution feeding tube 21a connected to a sample recovery unit (not shown) to the upper end section of the solution feeding pipe 18.

As described above, according to the present embodiment, the RF coil 22 is integrally formed on the side wall of the solution feeding pipe 18 which is commonly used for a plurality of samples. Therefore, unlike conventional configurations in which a diameter of an RF coil is set based on a test tube with a maximum assumed size among a plurality of test tubes used for analyzing a plurality of samples, a diameter dimension of the RF coil 22 can be set that is commensurate with a diameter dimension of the actually-used solution feeding pipe 18. As a result, the diameter dimension of the RF coil 22 can be significantly reduced. Therefore, according to the present embodiment, by reducing the diameter dimension of the RF coil 22, the diameter dimensions of the superconducting magnet 7, the vacuum container 12, the helium container 9, the heat shields 10 and 11, and the magnetic field correcting coil 4c which enclose the RF coil 22 can also be reduced. As a result, downsizing of the entire NMR analyzer can be achieved.

In addition, in the present embodiment, the RF coil 22 is integrally formed on the side wall of the solution feeding pipe 18 as described above. Accordingly, the diameter dimension of the RF coil 22 can be significantly reduced in comparison to conventional NMR analyzers. Therefore, a distance between a sample in the solution feeding pipe 18 and the RF coil 22 can be significantly reduced and, in turn, NMR signal detection sensitivity can be improved.

In the embodiment described above, the solution feeding pipe 18 is formed in a cylindrical shape and the RF coil 22 is provided along the side wall of the solution feeding pipe 18. In this manner, due to the formation of a flow channel with a circular section in the solution feeding pipe 18, the homogeneity of the magnetic field applied to a sample in the solution feeding pipe 18 by the magnetic field generating unit 2 can be increased in comparison to a case where a non-circular flow channel is formed. Therefore, NMR signal detection sensitivity with respect to the sample can be further improved.

Furthermore, in the embodiment described above, the RF coil 22 is formed along a cylindrical side wall that encloses a flow channel with a circular section. Accordingly, compared to a case where the RF coil 22 is formed on a flat plane, NMR signal detection sensitivity can be improved. Specifically, since the greater a ratio of a volume of a sample in a volume enclosed by the RF coil 22, the greater the NMR signal sensitivity, by forming the RF coil 22 along a side wall that encloses a flow channel with a circular cross section as in the embodiment described above, the ratio can be increased compared to a case where the RF coil 22 is formed on a flat plane. Accordingly, NMR signal sensitivity can be improved.

In the embodiment described above, the RF coil 22 is formed on an outer surface of the solution feeding pipe 18. As the solution feeding pipe 18 having such an RF coil 22, for example, a glass pipe having a metal (for example, copper) for forming the RF coil 22 deposited on an outer surface thereof can be adopted.

The embodiment described above is provided with the mounting member 16 that houses the solution feeding pipe 18 and the resonant circuit (the RF coil 22 and the circuit section 19). Since the RF coil 22 and the resonant circuit connected thereto are held inside the common mounting member 16 in this manner, by mounting the mounting member 16 to the magnetic field correcting unit 4, the solution feeding pipe 18 can be assembled onto the vacuum container 12 while protecting the resonant circuit that is vulnerable to external impact.

The embodiment described above is also provided with the connecting sections 20a and 20b for detachably attaching the solution feeding tubes 21a and 21b to the solution feeding pipe 18, and the mounting member 16 is configured so as to be detachably attachable to the magnetic field correcting unit 4 (the vacuum container 12). Therefore, by replacing the mounting member 16, the solution feeding pipe 18 and the resonant circuit (the RF coil 22 and the circuit section 19) can be collectively replaced.

Moreover, while an example in which the RF coil 22 is formed on the outer surface of the solution feeding pipe 18 has been described in the embodiment described above, the present invention is not limited thereto. For example, the RF coil 22 can alternatively be embedded inside the side wall of the solution feeding pipe 18. Hereinafter, a method of manufacturing the solution feeding pipe 18 in which the RF coil 22 can is embedded inside the side wall will be described with reference to FIGS. 6 to 10.

Figure 6:
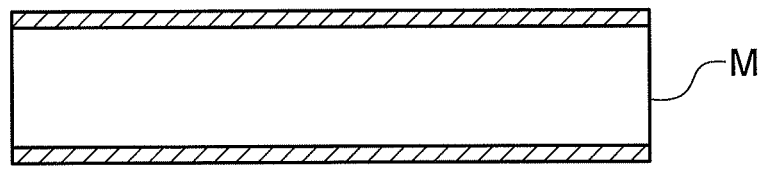
FIG. 6 is a sectional view which shows a method of manufacturing a solution feeding pipe in which an RF coil has been embedded in a side wall thereof and which shows a process of preparing a metallic pipe M.
Figure 7:
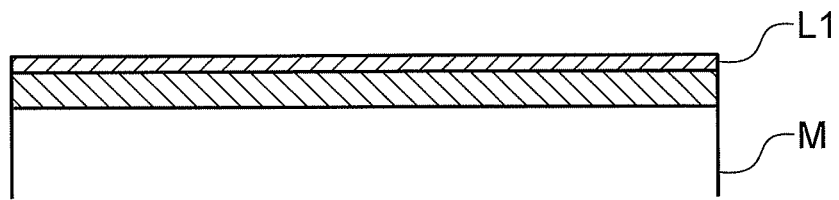
FIG. 7 is a sectional view which shows a method of manufacturing a solution feeding pipe in which an RF coil has been embedded in a side wall thereof and which shows a process of forming a first Si layer L1.
Figure 8:
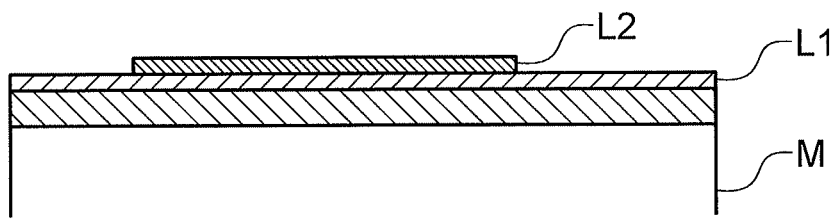
FIG. 8 is a sectional view which shows a method of manufacturing a solution feeding pipe in which an RF coil has been embedded in a side wall thereof and which shows a process of forming a Cu layer L2.
Figure 9:
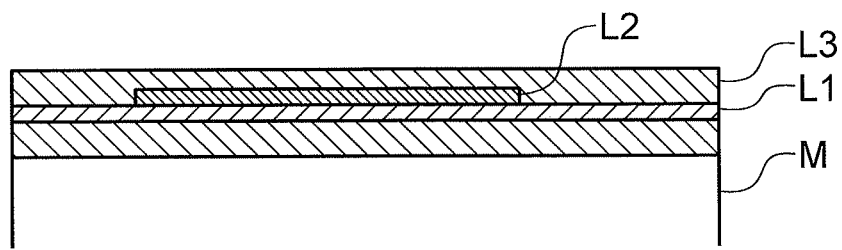
FIG. 9 is a sectional view which shows a method of manufacturing a solution feeding pipe in which an RF coil has been embedded in a side wall thereof and which shows a process of forming a second Si layer L3.
Figure 10:
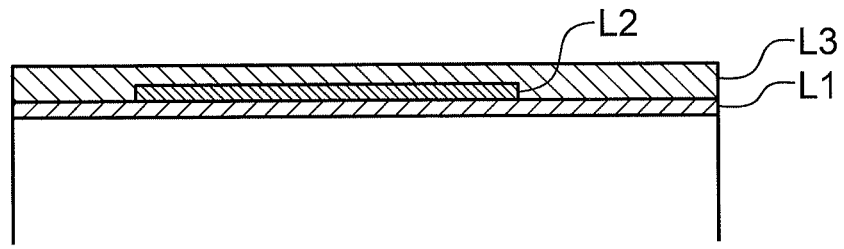
FIG. 10 is a sectional view which shows a method of manufacturing a solution feeding pipe in which an RF coil has been embedded in a side wall thereof and which shows a process of melting the metallic pipe M.
Figure 11:
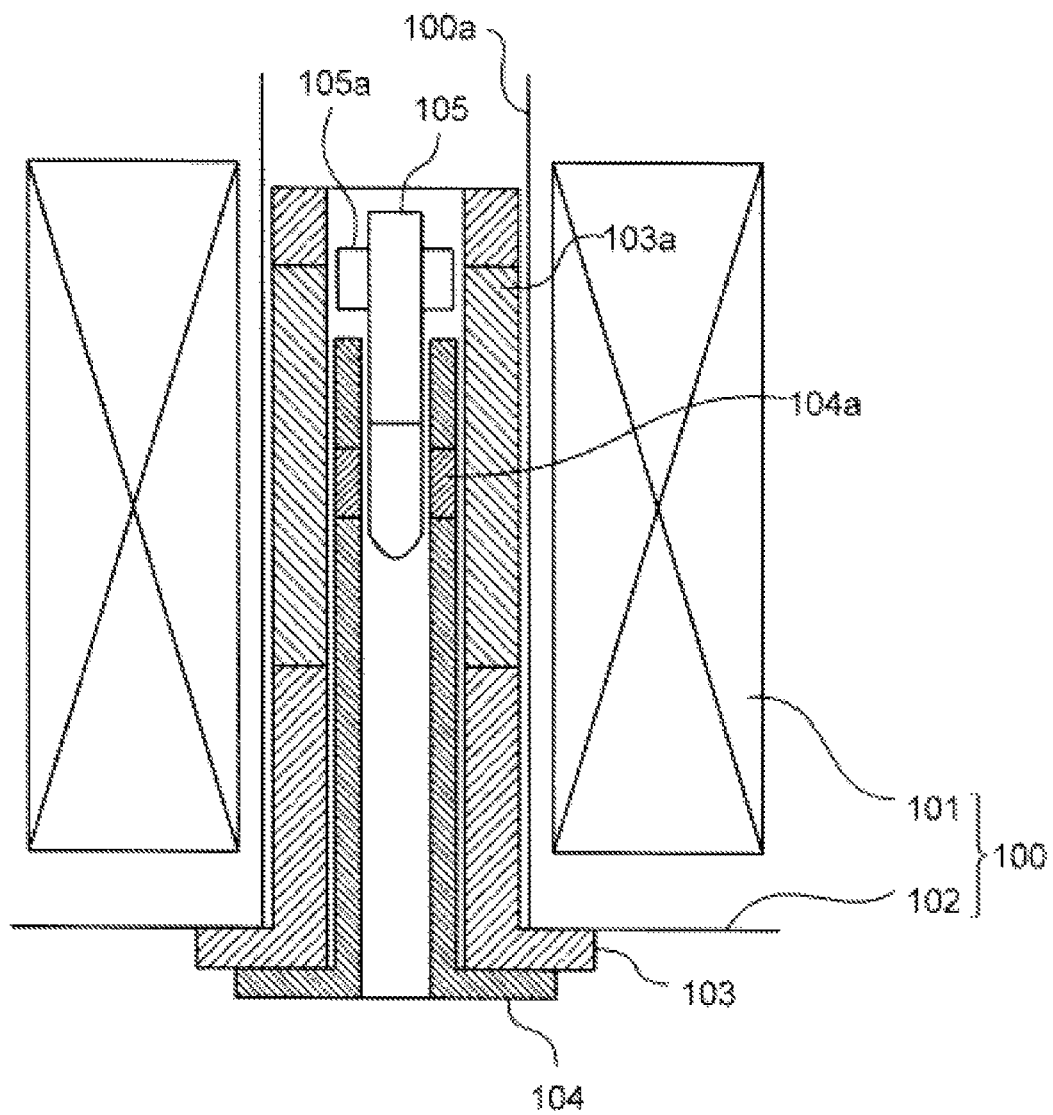
FIG. 11 is a front sectional view schematically showing a conventional NMR analyzer.
Figure 12:
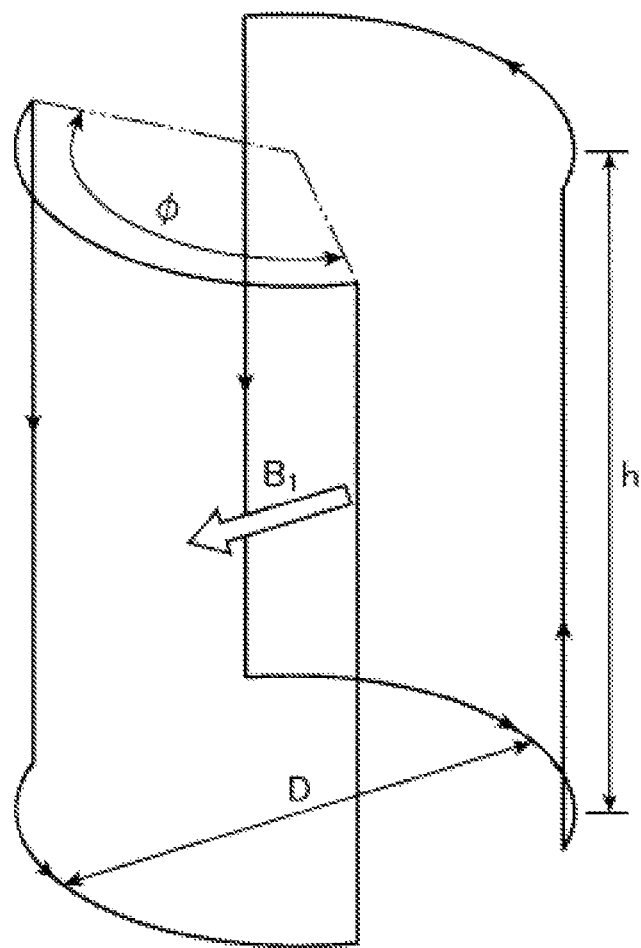
FIG. 12 is a perspective view showing a widely used saddle-shaped RF coil.

As shown in FIG. 6, first, a metallic pipe M cut to a predetermined length is prepared. Next, as shown in FIG. 7, silicon oxide ($SiO_2$) is deposited on an outer surface of the metallic pipe M by a method such as CVD (Chemical Vapor Deposition) or sputtering to form a first Si layer L1. Then, as shown in FIG. 8, copper is deposited (patterned) on a surface of the first Si layer L1 so as to correspond to the saddle shape of the RF coil 22 to form a Cu layer L2. Next, as shown in FIG. 9, silicon oxide ($SiO_2$) is deposited on surfaces of the first Si layer L1 and the Cu layer L2 by a method such as CVD or sputtering to form a second Si layer L3. Subsequently, a solvent for melting the metallic pipe M is injected into the metallic pipe M in order to remove the metallic pipe M as shown in FIG. 10. Accordingly, an RF coil embedded in silicon oxide can be manufactured.

By embedding the RF coil 22 in the side wall of the solution feeding pipe 18 in this manner, a distance between the RF coil 22 and a sample can be reduced compared to a case where the RF coil 22 is formed on the outer surface of the solution feeding pipe 18. As a result, NMR signal detection sensitivity can be further improved. Furthermore, since the outside of the RF coil 22 can be covered by the side wall of the solution feeding pipe 18, the RF coil 22 can be protected by the solution feeding pipe 18 itself.

While a configuration comprising the heat shields 10 and 11 has been described in the present embodiment, only one heat shield may be used. However, using a larger number of heat shields is more favorable in terms of reducing the amount of evaporation of the helium 8.

The specific embodiment described above primarily includes an invention configured as described below.

The inventors of the present application focused on the fact that, when analyzing a plurality of samples, by adopting a solution feeding pipe capable of alternately flowing a plurality of samples in place of a conventional test tube, NMR signals of the plurality of samples can be obtained while keeping the solution feeding pipe fixed to the side of an analyzer. As a result, the inventors of the present application have devised the following invention in which a detecting coil is formed in a solution feeding pipe instead of on the side of an analyzer and the detecting coil is commonly used for a plurality of samples.

Specifically, in order to solve the problem described above, the present invention provides a flow-through NMR analyzer for detecting an NMR signal of a sample fed from a solution feeding pump, the flow-through NMR analyzer comprising: a solution feeding pipe for flowing the sample fed from the solution feeding pump; a superconducting magnet that encloses a housing space, which is surrounded by a side wall of the solution feeding pipe, around an axis of the solution feeding pipe such that a static magnetic field is generated along the axis of the solution feeding pipe; a housing container which houses the superconducting magnet in a cooled state and which encloses the housing space around the axis of the solution feeding pipe; a magnetic field correcting coil which encloses the housing space around the axis of the solution feeding pipe between the housing container and the solution feeding pipe and which corrects homogeneity of a magnetic field in the housing space; and a detecting coil which applies high-frequency electromagnetic waves to the sample inside the housing space and which detects the NMR signal from the sample, wherein the detecting coil is integrally formed with the side walls of the solution feeding pipe in a region of the solution feeding pipe that is enclosed by the superconducting magnet and the magnetic field correcting coil.

In the present invention, a detecting coil is integrally formed on a side wall of a solution feeding pipe which is commonly used for a plurality of samples. Therefore, unlike conventional configurations in which a diameter of a detecting coil is set based on a test tube with a maximum assumed size among a plurality of test tubes used for analyzing a plurality of samples, a diameter dimension of a detecting coil can be set that is commensurate with a diameter dimension of an actually-used solution feeding pipe. As a result, the diameter dimension of the detecting coil can be significantly reduced. Therefore, according to the present invention, since a diameter dimension of the detecting coil can be reduced, diameter dimensions of the superconducting magnet, the housing container, and the magnetic field correcting coil which enclose the detecting coil can also be reduced. As a result, downsizing of the entire NMR analyzer can be achieved.

Furthermore, in the present invention, the detecting coil is integrally formed on the side wall of the solution feeding pipe as described above. Accordingly, the diameter dimension of the detecting coil can be significantly reduced in comparison to conventional NMR analyzers. Therefore, a distance between a sample in the solution feeding pipe and the detecting coil can be significantly reduced and, as a result, NMR signal detection sensitivity can be improved.

In the flow-through NMR analyzer described above, preferably, the solution feeding pipe is formed in a cylindrical shape and the detecting coil is provided along the side wall of the solution feeding pipe.

In this aspect, the solution feeding pipe is formed in a cylindrical shape. Accordingly, the impact on homogeneity of a magnetic field can be reduced in comparison to a case where a non-cylindrical solution feeding pipe is used. Therefore, NMR signal detection sensitivity with respect to a sample can be further improved.

Furthermore, in the aspect described above, the detecting coil is formed along a cylindrical side wall that encloses a flow channel with a circular section. Accordingly, compared to a case where the detecting coil is formed on a flat plane, NMR signal detection sensitivity can be improved. Specifically, since the greater a ratio of a volume of a sample among a volume enclosed by the detecting coil, the greater the NMR signal sensitivity, by forming the detecting coil along a side wall that encloses a flow channel with a circular cross section as in the mode described above, the ratio can be increased compared to a case where the detecting coil is formed on a flat plane. Accordingly, NMR signal sensitivity can be improved.

In the flow-through NMR analyzer described above, preferably, the detecting coil is formed on an outer surface of the side wall of the solution feeding pipe.

In this aspect, as the solution feeding pipe on which a detecting coil is formed, for example, a glass pipe having a metal for forming the detecting coil deposited on an outer surface thereof can be adopted.

In the flow-through NMR analyzer described above, preferably, the detecting coil is embedded in the side wall of the solution feeding pipe.

In this aspect, the detecting coil is embedded in the side wall of the solution feeding pipe. Therefore, compared to a case where a detecting coil is formed on an outer surface of the solution feeding pipe, a distance between the detecting coil and a sample can be reduced and, as a result, NMR signal detection sensitivity can be further improved. Furthermore, in the aspect described above, since the outside of the detecting coil can be covered by the side wall of the solution feeding pipe, the detecting coil can be protected by the solution feeding pipe itself.

Preferably, the flow-through NMR analyzer described above further comprises: a resonant circuit which is electrically connected to the detecting coil and which causes high-frequency electromagnetic waves to be generated in the detecting coil; and a mounting member which is formed in a tubular shape into which the solution feeding pipe can be inserted, which holds the solution feeding pipe and the resonant circuit in a state where the solution feeding pipe and the resonant circuit are housed inside the mounting member, and which is mounted to the housing container in a state of being inserted inside the magnetic field correcting coil.

In this aspect, the resonant circuit including the detecting coil is held inside a common mounting, member. Therefore, by mounting the mounting member to the housing container, the solution feeding pipe can be assembled onto the housing container while protecting the detecting coil and a circuit connected to the detecting coil which are vulnerable to external impact.

In the flow-through NMR analyzer described above, preferably, the solution feeding pipe has a first end section to which a feed tube for guiding the sample from the solution feeding pump is connected, and a second end section to which a discharge tube for guiding the sample discharged from the solution feeding pipe is connected, wherein the first end section of the solution feeding pipe has a first connecting section that is detachably attachable to the feed tube, the second end section of the solution feeding pipe has a second connecting section that is detachably attachable to the discharge tube, and the mounting member is detachably attachable to the housing container.

In this aspect, the solution feeding pipe is detachably attachable to the feed tube and the discharge tube, and the mounting member is detachably attachable to the housing container. Therefore, by replacing the mounting member, the solution feeding pipe and the resonant circuit including the detecting coil can be collectively replaced.

INDUSTRIAL APPLICABILITY

According to the present invention, a compact flow-through NMR analyzer with high NMR signal detection sensitivity can be provided.

EXPLANATION OF REFERENCE NUMERALS

D1 to D5 diameter dimension
1 Flow-through NMR analyzer 4c magnetic field correcting coil
5 probe
6 solution feeding pump
7 superconducting magnet
12 vacuum container (housing container)
16 mounting member
18 solution feeding pipe
19 circuit section
20a, 20b connecting section
21a solution feeding tube (discharge tube)
21b solution feeding tube (feed tube)
22 RF coil

The invention claimed is:

1. A flow-through Nuclear Magnetic Resonance (NMR) analyzer for detecting an NMR signal of a sample fed from a solution feeding pump, the flow-through NMR analyzer comprising:
   a solution feeding pipe for flowing the sample fed from the solution feeding pump;
   a superconducting magnet that encloses a housing space, which is surrounded by a side wall of the solution feeding pipe, around an axis of the solution feeding pipe such that a static magnetic field is generated along the axis of the solution feeding pipe;
   a housing container which houses the superconducting magnet in a cooled state and which encloses the housing space around the axis of the solution feeding pipe;
   a magnetic field correcting coil which encloses the housing space around the axis of the solution feeding pipe between the housing container and the solution feeding pipe and which corrects homogeneity of a magnetic field in the housing space; and
   a detecting coil which applies high-frequency electromagnetic waves to the sample inside the housing space and which detects the NMR signal from the sample, wherein
   the detecting coil is integrally formed with the side wall of the solution feeding pipe in a region of the solution feeding pipe that is enclosed by the superconducting magnet and the magnetic field correcting coil, and the detecting coil is embedded in the side wall of the solution feeding pipe.

2. The flow-through NMR analyzer according to claim 1, wherein
   the solution feeding pipe is formed in a cylindrical shape, and
   the detecting coil is provided along the side wall of the solution feeding pipe.

3. The flow-through NMR analyzer according to claim 1, further comprising:
   a resonant circuit which is electrically connected to the detecting coil and which causes high-frequency electromagnetic waves to be generated in the detecting coil; and
   a mounting member which is formed in a tubular shape into which the solution feeding pipe can be inserted, which holds the solution feeding pipe and the resonant circuit in a state where the solution feeding pipe and the resonant circuit are housed inside the mounting member, and which is mounted to the housing container in a state of being inserted inside the magnetic field correcting coil.

4. The flow-through NMR analyzer according to claim 3, wherein
   the solution feeding pipe has a first end section to which a feed tube for guiding the sample from the solution feeding pump is connected, and a second end section to which a discharge tube for guiding the sample discharged from the solution feeding pipe is connected,
   the first end section of the solution feeding pipe has a first connecting section that is detachably attachable to the feed tube,
   the second end section of the solution feeding pipe has a second connecting section that is detachably attachable to the discharge tube, and
   the mounting member is detachably attachable to the housing container.

5. The flow-through NMR analyzer according to claim 1, wherein
   the detecting coil is formed via patterning and/or deposition.

* * * * *